United States Patent [19]
Ochiai et al.

[11] Patent Number: 5,916,713
[45] Date of Patent: *Jun. 29, 1999

[54] POLYMERIZABLE COMPOSITION FOR A COLOR FILTER

[75] Inventors: Tameichi Ochiai; Ryuichiro Takasaki; Noriko Endou; Yuzuru Chika, all of Yokohama, Japan

[73] Assignee: Mitsubishi Chemical Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/704,761

[22] PCT Filed: Nov. 29, 1995

[86] PCT No.: PCT/JP95/02437

§ 371 Date: Sep. 25, 1996

§ 102(e) Date: Sep. 25, 1996

[87] PCT Pub. No.: WO96/23237

PCT Pub. Date: Jan. 8, 1996

[30] Foreign Application Priority Data

Jan. 25, 1995 [JP] Japan ...................................... 7-10109

[51] Int. Cl.$^6$ .................. C08F 2/50; G03F 9/00
[52] U.S. Cl. .................. 430/7; 522/17; 522/18; 522/26; 522/27; 522/81; 522/121; 522/149
[58] Field of Search .................. 522/121, 149, 522/71, 81, 17, 18, 26, 27; 430/7

[56] References Cited

U.S. PATENT DOCUMENTS

| | | | |
|---|---|---|---|
| 4,164,423 | 8/1979 | Schumacher et al. | 522/71 |
| 4,934,791 | 6/1990 | Shimizu et al. | 350/317 |
| 5,085,973 | 2/1992 | Shimizu et al. | 430/271 |
| 5,489,621 | 2/1996 | Sato et al. | 522/81 |
| 5,605,740 | 2/1997 | Tomiyama et al. | 428/200 |
| 5,641,595 | 6/1997 | Hsieh et al. | 430/7 |
| 5,650,233 | 7/1997 | Miyake et al. | 428/441 |
| 5,718,746 | 2/1998 | Nagasawa et al. | 16/31.9 |
| 5,721,076 | 2/1998 | Watanabe et al. | 522/81 |
| 5,800,952 | 9/1998 | Urano et al. | 430/7 |
| 5,821,016 | 10/1998 | Satoh et al. | 430/7 |

FOREIGN PATENT DOCUMENTS

| | | |
|---|---|---|
| 0 713 144 | 5/1996 | European Pat. Off. . |
| 0 726 279 | 8/1996 | European Pat. Off. . |
| 6-11831 | 1/1994 | Japan . |
| 2 219 591 | 12/1989 | United Kingdom . |

OTHER PUBLICATIONS

Database WPI, Derwent Publications, AN 96–137641, KR 9 405 617, Jun. 21, 1994.

Database WPI, Derwent Publications, AN 92–369438, JP 4 270 345, Sep. 25, 1992.

*Primary Examiner*—Susan W. Berman
*Attorney, Agent, or Firm*—Oblon, Spivak, McClelland, Maier & Neustadt, P.C.

[57] ABSTRACT

The present invention provides a polymerizable composition for a color filter, which comprises a (meth)acrylate copolymer containing alicyclic (meth)acryloyl groups in its side chains, a compound having at least one ethylenically unsaturated double bond, a photopolymerization initiator and a colorant, a color filter obtained by coating the composition on a glass substrate, followed by exposure and development; and a method for producing a color filter, which comprises coating the composition on a glass substrate, followed by exposure and development.

The polymerizable composition of the present invention is highly sensitive and excellent in chemical resistance. Accordingly, according to the present invention, it is possible to produce a color filter of a high quality without a protective layer such as an oxygen-shielding film.

6 Claims, No Drawings

POLYMERIZABLE COMPOSITION FOR A COLOR FILTER

TECHNICAL FIELD

The present invention relates to a polymerizable composition suitable for the production of a color filter which is to be used in combination with a liquid crystal display device or a solid image pick-up device, a color filter produced by using such a polymerizable composition, and a method for its production.

BACKGROUND ART

As a color filter, one having picture elements of red, green, blue, etc. formed on a glass substrate by a dyeing method, a printing method, an electro deposition method, a pigment dispersion method or the like, is used. A color filter by a dyeing method is produced in such a manner that an image is formed by a photosensitive resin prepared by mixing a dichromate as a photosensitive material to gelatin or polyvinyl alcohol, followed by dyeing. To form multi colors on the same substrate, reserve printing steps are required, whereby there is a problem that the process tends to be complex. Further, since dyes are used, it is poor in light resistance. The dichromate used as a photosensitive material is problematic also from the viewpoint of prevention of pollution.

A color filter by a printing method is prepared by transferring a heat-curable or photo-curable ink onto a glass substrate by such a method as screen printing or flexographic printing. The process is simple without necessity of dyeing or forming an image. However, a highly fine image can not thereby be obtained, and there is a problem in flatness of the ink.

A color filter by an electro deposition method is prepared by immersing a glass substrate provided with electrodes, in a bath containing a pigment or dye, whereby a color phase is deposited on the substrate by electrophoresis. It is excellent in flatness, but it is difficult to form a complicated pattern, since it is necessary to provide electrodes to the glass substrate beforehand.

In the pigment dispersion method, an image is formed by a colored resist having a pigment dispersed in a photo-curable resin. It has a merit such as high heat resistance or no necessity of dyeing, and it is capable of forming a highly precise image. Accordingly, this method is currently the most popular method for producing color filters. However, a colored resist having a pigment dispersed in a high concentration, is used, whereby the photo curability is poor, and the sensitivity is low, and further, there is a serious problem in the operation efficiency, since the chemical resistance is also low.

In the pigment dispersion method, image formation is carried out by a colored resist having a pigment dispersed in a high concentration. Accordingly, strong light absorption takes place by the pigment, and cure-inhibition by oxygen takes place, whereby the sensitivity used to be low. Accordingly, in order to form an image, a long period of exposure time is required, whereby the operation efficiency is very poor, and in order to prevent the cure-inhibition by oxygen, it is necessary to further form a protecting film to shield oxygen on the resist film, which makes the process further complex. Further, the image formed in such a manner is not sufficiently photo-cured, whereby the image is poor in the heat resistance and chemical resistance, and it has been necessary to protect the colored image at the time of forming a polyimide film which serves as an orientation film for liquid crystal.

An object of the present invention is to solve the above-mentioned problems of the conventional colored resists and to provide a polymerizable composition for a color filter having a high sensitivity and being excellent in chemical resistance.

Another object of the present invention is to provide a color filter of a high quality by using such a polymerizable composition.

The present inventors have strenuously proceeded with a research for the above objects and as a result, have found that a polymerizable composition for a color filter comprising, as an organic polymer material, a (meth) acrylate copolymer containing alicyclic (meth)acryloyl groups in its side chains, is highly sensitive, provides a high resolution and is excellent also in chemical resistance and pigment-dispersibility. The present invention has been accomplished on the basis of this discovery. In the present specification, "(meth)acryl . . . " and "(meth)acryloyl . . . " mean "acryl . . . or methacryl . . . " and "acryloyl . . . or methacryloyl . . . ". For example, "(meth)acrylic acid" means "acrylic acid or methacrylic acid".

DISCLOSURE OF THE INVENTION

Namely, the present invention resides in a polymerizable composition for a color filter, which comprises a (meth) acrylate copolymer containing alicyclic (meth)acryloyl groups in its side chains, a compound having at least one ethylenically unsaturated double bond, a photopolymerization initiator and a colorant.

Further, the present invention resides in a color filter obtained by coating the above polymerizable composition on a glass substrate, followed by exposure and development.

Still further, the present invention resides in a method for producing a color filter, which comprises coating the above polymerizable composition on a glass substrate, followed by exposure and development.

Now, the present invention will be described in detail.

In the present invention, as the resin, a (meth)acrylate copolymer having alicyclic (meth)acryloyl groups as polymerizable groups in its side chains, is used. As a synthetic means for introducing such polymerizable groups to a resin, a method disclosed in e.g. Japanese Examined Patent Publication No. 34443/1975 or No. 34444/1975, is known. Specifically, a resin having polymerizable groups in its side chains, can be obtained by reacting e.g. a compound which has both a (meth)acryloyl group and an aliphatic epoxy group such as an epoxycyclohexyl group or an epoxycyclopentyl group, to carboxyl groups or hydroxyl groups in the resin. As a preferred example of the above compound, epoxycyclohexylmethyl (meth)acrylate or epoxycyclopentylmethyl (meth)acrylate may be mentioned. The most preferred among them is (3,4-epoxycyclohexyl)methyl (meth) acrylate.

In the present invention, alicyclic groups are introduced in side chains of the resin to be used as a binder, whereby it is possible to obtain a polymerizable composition for a color filter, which is excellent particularly in adhesion and has high chemical resistance.

The resin skeleton to which (meth)acryloyl groups are introduced as polymerizable groups, is a (meth)acrylate copolymer which may, for example, be a copolymer prepared by copolymerizing (meth)acrylic acid with a monomer which may, for example, be a styrene which may be substituted by an alkyl group at the α-position, such as styrene or α-methylstyrene, methyl (meth)acrylate, ethyl (meth)

acrylate, propyl (meth)acrylate, isopropyl (meth)acrylate, butyl (meth)acrylate, vinyl acetate, acrylonitrile, (meth) acrylamide, glycidyl (meth)acrylate, allylglycidyl ether, glycidyl ethyl acrylate, crotonylglycidyl ether, crotonic acid glycidyl ether, (meth)acrylic acid chloride, benzyl (meth) acrylate, hydroxyethyl (meth)acrylate, N-methylolacrylamide, N,N-dimethylacrylamide, N-methacryloylmorpholine, N,N-dimethylaminoethyl (meth)acrylate or N,N-dimethylaminoethylacrylamide. Particularly preferred is a copolymer comprising, as copolymer components, (meth)acrylic acid and styrene which may be substituted by an alkyl group at the α-position. The proportion of (meth)acrylic acid in the copolymer is preferably from 0.2 to 0.8, more preferably from 0.3 to 0.7, by a molar ratio. Further, the proportion of the above-mentioned copolymer component such as styrene, in the copolymer, is preferably from 0.8 to 0.2, more preferably from 0.7 to 0.3.

The weight average molecular weight, as measured by GPC, of the (meth)acrylate copolymer to be used in the present invention, is preferably from 1,000 to 50,000. If the weight average molecular weight is less than 1,000, it tends to be difficult to obtain a uniform coating film. On the other hand, if it exceeds 50,000, it tends to be unstable and tends to undergo gelation. Further, a preferred content of acidic groups such as carboxyl groups, is at a level of from 5 to 200 by acid value. If the acid value is less than 5, it tends to be insoluble in an alkali developing solution, and if it exceeds 200, the sensitivity may sometimes decrease.

As the photopolymerization initiator, any one of conventional initiators may be employed. However, from the viewpoint of the sensitivity and chemical resistance, a combination of an imidazole compound and an aminobenzene derivative, a 2-amino-2-benzoyl-1-phenylalkane compound, a halomethylate triazine compound or a halomethyloxadiazole, is preferred.

As a preferred imidazole compound, one having the following structure in which two imidazoles are bonded by one covalent bond:

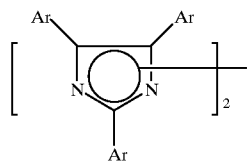

wherein Ar is an aryl group which may be substituted, may be mentioned.

As the aryl group which may be substituted, a phenyl group which may be substituted, is preferred. As the substituent on the aryl group, a halogen atom such as a fluorine atom, a chlorine atom or a bromine atom, a nitro group, a methyl group, or a methoxy group, may, for example, be mentioned. A hexaphenyl biimidazole wherein the opposition of a phenyl group at each of the 2- and 2'-positions, is substituted by a halogen atom such as a fluorine atom, a chlorine atom or a bromine atom, a nitro group or a methyl group, is particularly advantageous from the viewpoint of the properties such as heat stability and photo reaction rate.

Specific examples of the hexaarylbiimidazole include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, and 2,2'-bis(o-methylphenyl)-4,4',5,5'-tetraphenylbiimidazole. Particularly, 2,2'-bis(o-chlorophenyl)-4,4',5,5'-tetraphenylbiimidazole is advantageously used.

These hexaarylbiimidazoles can readily be prepared by the methods disclosed in e.g. Bull. Chem. Soc. Japan, 33, 565(1960) and J. Org. Chem., 36, 2262(1971).

The aminobenzene derivative is a compound having an aminophenyl group moiety in its structure, and it may, for example, be a benzophenone compound such as 4,4'-dimethylaminobenzophenone, 4,4'-diethylaminobenzophenone, 2-aminobenzophenone, 4-aminobenzophenone, 4,4'-diaminobenzophenone, 3,3'-diaminobenzophenone or 3,4-diaminobenzophenone, or a p-diaralkylaminophenyl group-containing compound such as 2-(p-dimethylaminophenyl)benzoxazole, 2-(p-diethylaminophenyl)benzoxazole, 2-(p-dimethylaminophenyl)benzo[4,5]benzoxazole, 2-(p-dimethylaminophenyl)benzo[6,7]benzoxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl) pyridine, 2-(p-dimethylaminophenyl)quinoline, 2-(p-diethylaminophenyl)quinoline, 2-(p-dimethylaminophenyl) pyrimidine or 2-(p-diethylaminophenyl)pyrimidine.

Particularly preferred is 4,4'-dimethylaminobenzophenone, 4,4'-diethylaminobenzophenone, 2-(p-dimethylaminophenyl) benzoxazole, 2-(p-dimethylaminophenyl)benzothiazole or 2-(p-diethylaminophenyl)benzimidazole.

The 2-amino-2-benzoyl-1-phenylalkane compound as the photopolymerization initiator to be used in the present invention, is represented by the formula (1):

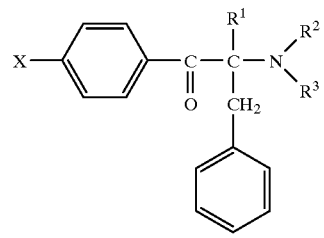

(ka 1)

wherein each of $R^1$, $R^2$ and $R^3$ which are independent of one another, is a hydrogen atom or a $C_{1-4}$ alkyl group, and X is a morpholino group or a $SR^4$ group, wherein $R^4$ is a $C_{1-6}$ alkyl group or a phenyl group.

The compounds of the following formulas (2) to (9) may be mentioned as specific examples of the 2-amino-2-benzoyl-1-phenylalkane compound:

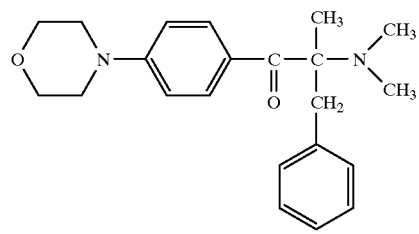
(2)

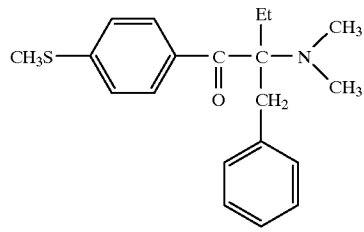
(8)

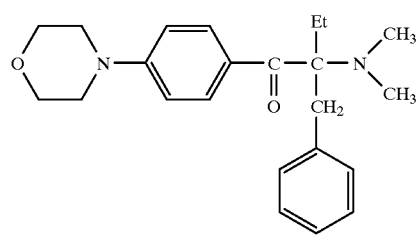
(3)

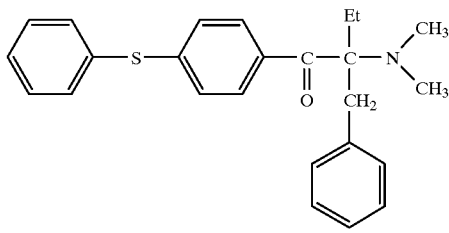
(9)

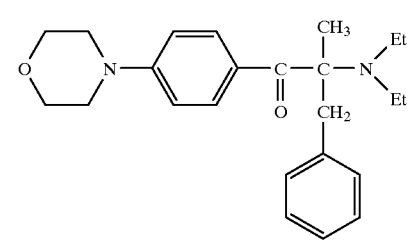
(4)

Preferred among the 2-amino-2-benzoyl-1-phenylalkane compounds of the formula (1), is a compound of the same formula in which each of $R^1$, $R^2$ and $R^3$ which are independent of one another, is a $C_{1-4}$ alkyl group, and X is a morpholino group. More preferred is a compound wherein $R^1$ is a $C_{1-4}$ alkyl group, and each of $R^2$ and $R^3$ which are independent of each another, is a $C_{1-2}$ alkyl group.

The halomethylated triazine compound as the photopolymerization initiator to be used in the present invention, is represented by the formula (10):

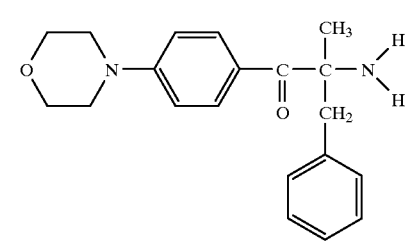
(5)

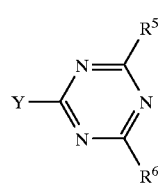
(10)

wherein each of $R^5$ and $R^6$ is a halomethyl group, and Y is an organic group having at least 5 carbon atoms. The halomethyl group may, for example, be a trichloromethyl group, a tribromomethyl group, a dichloromethyl group or a dibromomethyl group, and the organic group having at least 5 carbon atoms may, for example, be a phenyl group, a naphthyl group, a styryl group, a styrylphenyl group, a furylvinyl group or a quaternary aminoethylamino group, which may have a substituent.

The compounds of the following formulas (11) to (32) may be mentioned as specific examples of the halomethylated triazine compound:

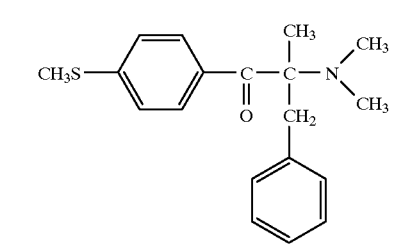
(6)

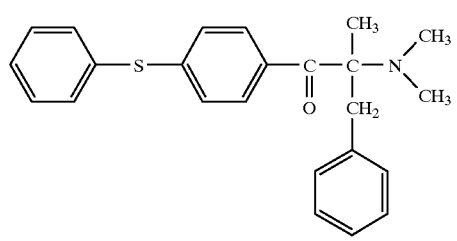
(7)

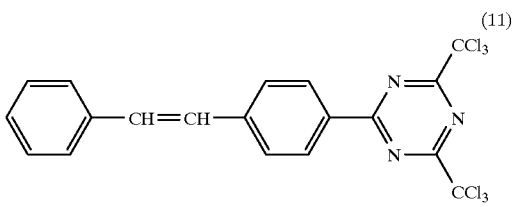
(11)

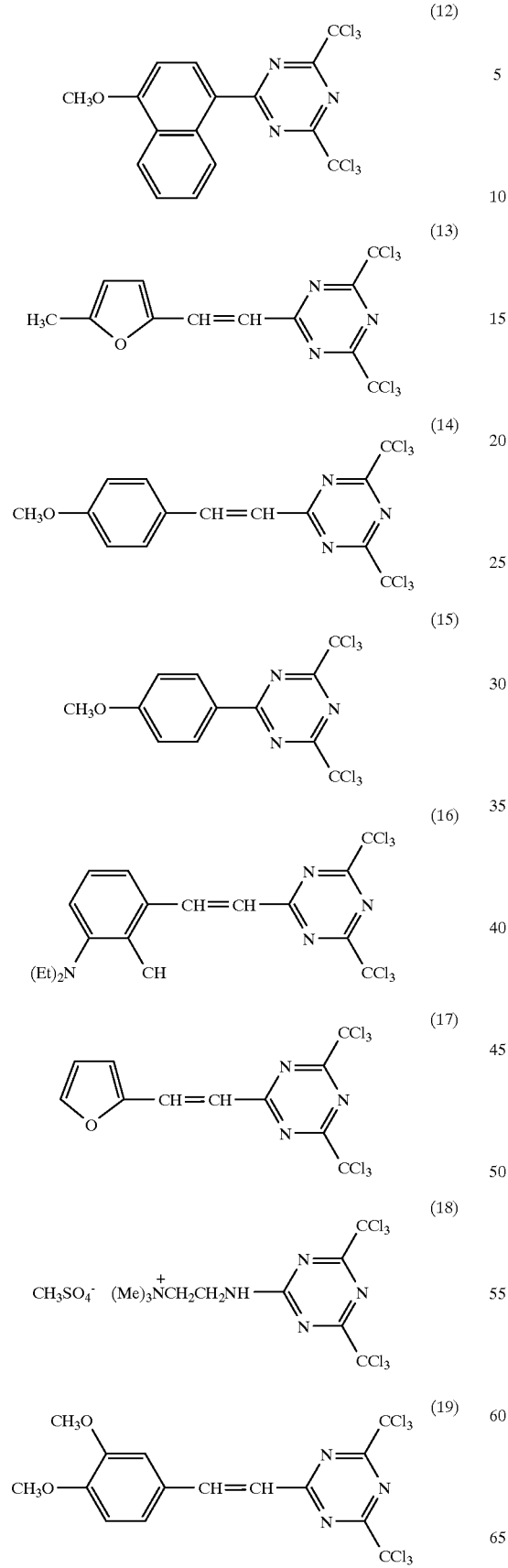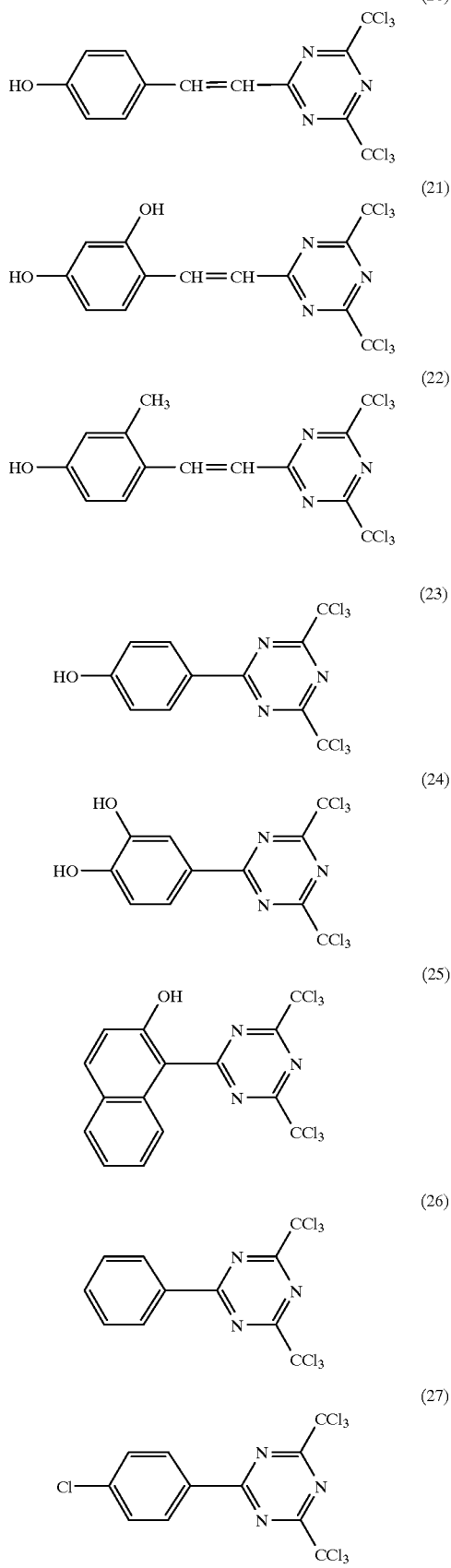

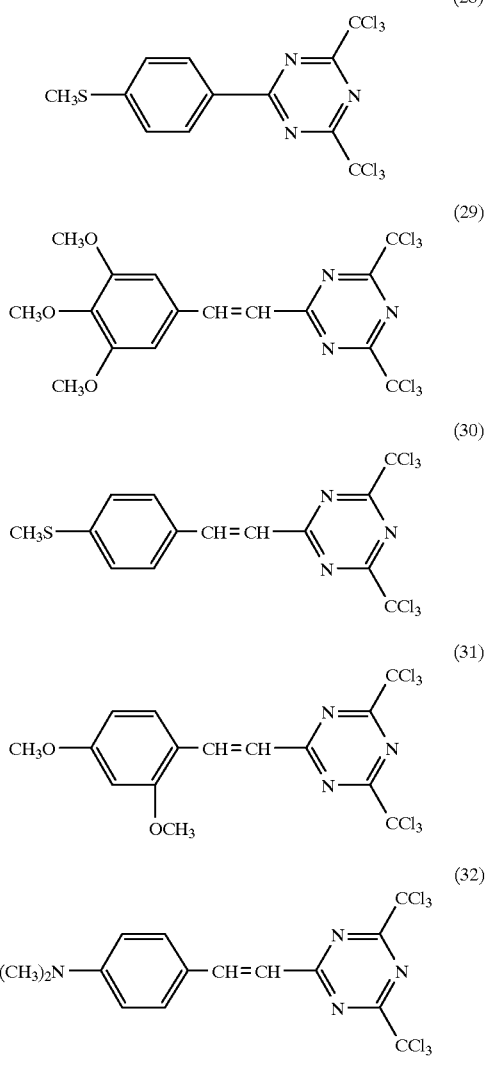

(28)

(29)

(30)

(31)

(32)

Preferred among the halomethylated triazine compounds of the formula (10), are compounds of the following formulas (33) to (35):

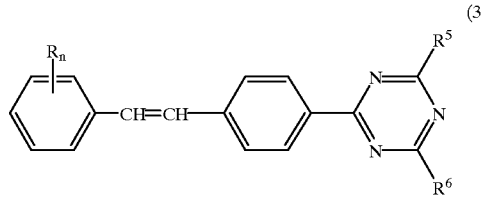

(33)

wherein each of $R^5$ and $R^6$ is a halomethyl group, each R which is independent, is a $C_{1-4}$ alkyl group or a $C_{1-4}$ alkoxy group, and n is an integer of from 0 to 3.

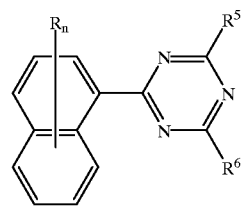

(34)

wherein each of $R^5$ and $R^6$ is a halomethyl group, each R which is independent, is a $C_{1-4}$ alkyl group or a $C_{1-4}$ alkoxy group, and n is an integer of from 0 to 3.

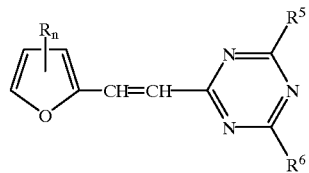

(35)

wherein each of $R^5$ and $R^6$ is a halomethyl group, each R which is independent, is a $C_{1-4}$ alkyl group, and n is an integer of from 0 to 1.

Preferred among the compounds of the formulas (33) to (35), are compounds wherein each of $R^5$ and $R^6$ is a trichloromethyl group, the carbon number of R is 1 or 2, and n is an integer of from 0 to 2 in the case of the formulas (33) and (34) and an integer of from 0 to 1 in the case of the formula (35).

The halomethylated oxadiazole compound as the photopolymerization initiator to be used in the present invention, is represented by the formula (36):

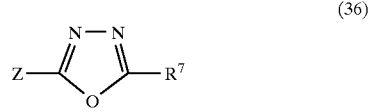

(36)

wherein $R^7$ is a halomethyl group, and Z is a benzofuryl group or a benzofurylvinyl group which may have a substituent.

Compounds of the following formulas (37) to (54) may be mentioned as specific examples of the halomethylated oxadiazole compound:

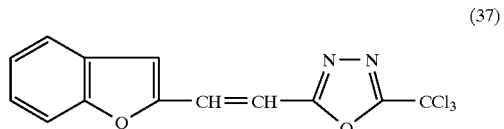

(37)

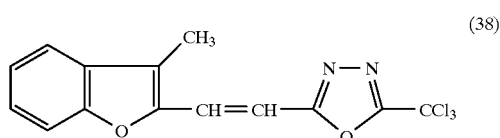

(38)

Preferred among the halomethylated oxadiazole compounds of the formula (36), is a compound of the following formula (55):

wherein $R^7$ is a halomethyl group, each R which is independent, is a $C_{1-4}$ alkyl group or a $C_{1-4}$ alkoxy group, and n is an integer of from 0 to 2. More preferred is a compound wherein $R^7$ is a trichloromethyl group, each R which is independent, is a $C_{1-2}$ alkyl group or a $C_{1-2}$ alkoxy group, and n is an integer of from 0 to 1.

In addition to the foregoing photopolymerization initiator, a hydrogen donative compound such as 2-mercaptobenzothiazole, 2-mercaptobenzoxazole or 2-mercaptobenzimidazole, may be incorporated to further improve the sensitivity and adhesion.

The compound having at least one ethylenically unsaturated double bond, to be used as a photopolymerizable monomer, is preferably a compound containing at least one, more preferably at least 3, acryloyl groups, but it is not restricted thereto. Specifically, it may, for example, be isobutyl acrylate, t-butyl acrylate, lauryl acrylate, cetyl acrylate, stearyl acrylate, cyclohexyl acrylate, isobonyl acrylate, benzyl acrylate, 2-methoxyethyl acrylate, 3-methoxybutyl acrylate, ethylcarbitol acrylate, phenoxyethyl acrylate, tetrahydrofuryl acrylate, phenoxypolyethylene glycol acrylate, methoxypropylene glycol acrylate, hydroxyethyl acrylate, 2-hydroxypropyl acrylate, 2-acryloyloxyethylhydrogen phthalate, 2-acryloyloxypropylhydrogen phthalate, 2-acryloyloxypropylhydrogen phthalate, 2-acryloyloxypropyltetrahydrohydrogen phthalate, morpholinoethyl methacrylate, trifluoroethyl acrylate, trifluoroethyl methacrylate, tetrafluoropropyl (meth)acrylate, hexafluoropropyl (meth)acrylate, octafluoropentyl (meth)arylate, heptadecafluorododecyl acrylate, trimethylcyclohexylethyl methacrylate, 1,4 -butanediol diacrylate, 1,6-hexanediol diacrylate, 1,9-nonanediol diacrylate, neopentyl glycol diacrylate, tetraethylene glycol diacrylate, tripropylene glycol diacrylate, propylene glycol diacrylate, glycerol methacrylate acrylate, bisphenol A, an EO adduct diacrylate, trimethylol propane triacrylate, pentaerythritol triacrylate, pentaerythritol tetraacrylate, trimethylolpropane EO-added triacrylate, glycerol PO-added triacrylate, trisacryloyloxyethyl phosphate, dipentaerythritol hexaacrylate, a novolak epoxy acrylic acid-modified product, a novolak epoxy acrylic acid and acid anhydride-modified product, N-vinylpyrrolidone, N-vinylcaprolactam, acrylic isocyanurate, dipentaerythritol monohydroxy pentaacrylate, urethane acrylate or an unsaturated polyester acrylate. Among these monomers, an at least trifunctional acrylate monomer is preferred. These monomers may be used alone or in combination as a mixture of a plurality of them.

The pigment may, for example, be an inorganic pigment such as barium sulfate, lead sulfate, titanium oxide, yellow lead oxide, iron oxide red, chromium oxide or carbon black, or an organic pigment such as an anthraquinone pigment, a perylene pigment, a disazo pigment, a phthalocyanine pigment, an isoindoline pigment, a dioxazine pigment, a quinacridone pigment, a perynone pigment, a triphenylmethane pigment or a thioindigo pigment. These pigments may be used alone or in admixture. Specifically, pigments represented by the following color index (C.I) numbers, may, for example, be mentioned.

C.I. red: 9, 97, 122, 123, 149, 168, 177, 180, 192, 215, 216, 217, 220, 223, 224, 226, 227, 228, 240

C.I. blue: 15, 15; 6, 22, 60, 64

C.I. green: 7, 36

C.I. black: 7

C.I. yellow: 20, 24, 86, 93, 109, 110, 117, 125, 137, 138, 147, 148, 153, 154, 166, 168

C.I. orange: 36, 43, 51, 55, 59, 61

C.I. violet: 19, 23, 29, 30, 37, 40, 50

C.I. brown: 23, 25, 26

It is particularly preferred to use, as the pigment, at least one member selected from the group consisting of an anthraquinone pigment, a phthalocyanine pigment, an azo pigment, a dioxazine pigment and carbon black.

Further, with a colored resist having a black pigment such as carbon black dispersed to form a black matrix, there has been a problem that the dispersibility of the pigment is poor, the operation efficiency for coating is poor, foreign matters are likely to remain on the resist film, or pin hole defects are likely to form. However, the (meth)acrylate copolymer having alicyclic (meth)acryloyl groups in its side chains, is capable of having a black pigment, particularly carbon black, dispersed very well, so that foreign matters on the resist film will be little, it is possible to form a black matrix of a high quality, and it is possible to present a color filter of a high quality.

The average particle size of such a pigment is preferably within a range of from 0.005 to 0.5 μm, more preferably from 0.01 to 0.3 μm. If the average particle size is lower than this range, thixotropic properties are likely to result, whereby excellent coating properties can hardly be obtained. On the other hand, if it exceeds the above range, the coating film tends to be poor in transparency. To attain such a particle size, a ball mill, a sand mill, a beads mill, a three roll mill, a paint shaker or a dispersion treatment by means of supersonic waves, is effective.

The solvent may specifically be an organic solvent such as diisopropyl ether, mineral spirit, n-pentane, amyl ether, ethyl caprylate, n-hexane, diethyl ether, isoprene, ethyl isobutyl ether, butyl stearate, n-octane, Varsol #2, Apco #18 solvent, diisobutylene, amyl acetate, butyl butyrate, Apco thinner, butyl ether, diisobutyl ketone, methyl cyclohexene, methyl nonyl ketone, propyl ether, dodecane, Socal solvent No. 1 and No. 2, amyl formate, dihexyl ether, diisopropyl ketone, Solveso #15, (n, sec, t)-butyl acetate, hexene, Shell TS28 solvent, butyl chloride, ethyl amyl ketone, ethyl benzoate, amyl chloride, ethylene glycol diethyl ether, ethyl orthoformate, methoxymethylpentanone, methyl butyl ketone, methyl hexyl ketone, methyl isobutyrate, benzonitrile, ethyl propionate, methyl cellosolve acetate, methyl isoamyl ketone, methyl isobutyl ketone, propyl acetate, amyl acetate, amyl formate, bicyclohexyl, diethylene glycol monoethyl ether acetate, dipentene, methoxymethylpentanol, methyl amyl ketone, methyl isopropyl ketone, propyl propionate, propylene glycol t-butyl ether, methyl ethyl ketone, methyl cellosolve, ethyl cellosolve, ethyl cellosolve acetate, carbitol, cyclohexanone, ethyl acetate, propylene glycol, propylene glycol monomethyl ether, propylene glycol monomethyl ether acetate, propylene glycol monoethyl ether, propylene glycol monoethyl ether acetate, dipropylene glycol monoethyl ether, dipropylene glycol monomethyl ether, propylene glycol monoethyl ether acetate, dipropylene glycol monomethyl ether acetate, 3-methoxypropionic acid, 3-ethoxypropionic acid, methyl 3-ethoxypropionate, methyl 3-methoxypropionate, ethyl 3-methoxypropionate, 3-ethoxypropionic acid, propyl 3-methoxypropionate, butyl 3-methoxypropionate, diglyme, dipropylene glycol monomethyl ether, ethylene glycol acetate, ethylcarbitol, butylcarbitol, ethylene glycol monobutyl ether, propylene glycol t-butyl ether, 3-methyl-3-methoxybutanol, tripropylene glycol methyl ether or 3-methyl-3-methoxybutyl acetate.

The solvent is preferably selected among those having boiling points within a range of from 100° C. to 200° C. More preferably, it is the one having a boiling point of from 120° C. to 170° C. Such solvents may be used alone or in admixture. Propylene glycol methyl ether acetate can be used particularly advantageously.

The proportions of the respective components used for the polymerizable composition for a color filter of the present invention vary depending upon the types of the compounds to be used. However, usually, the photopolymerization initiator is incorporated in an amount within a range of from 0.05 to 50 parts by weight, preferably from 0.05 to 30 parts by weight, the photopolymerizable monomer from 5 to 200 parts by weight, the pigment from 10 to 500 parts by weight, preferably the solvent from 200 to 500 parts by weight, per 100 parts by weight of the (meth)acrylate copolymer having (meth)acryloyl groups in its side chains. Further, the content (P) of the pigment is preferably such that P/V i.e. the ratio to the solid content (V) other than the pigment, is within a range of from 0.15 to 0.60. However, in a case of a polymerizable composition for black matrix containing a black pigment such as carbon black, it is advisable that P/V is within a range of from 0.5 to 1.5, preferably from 0.7 to 1.4, most preferably from 0.9 to 1.3, in order to form a black matrix with an optical density of at least 2.5, preferably at least 3.0, as a coating film formed in a film thickness of at most 1.0 μm, preferably from 0.3 to 0.9 μm, more preferably from 0.4 to 0.8 μm.

If the content of the photopolymerization initiator is less than the above range, no adequate sensitivity tends to be obtained, and if it exceeds the above range, the internal curing property tends to be poor, and in some cases, the initiator undergoes recrystallization and precipitates. If the amount of the monomer is less than the above range, the crosslinking density of an image portion subjected to exposure tends to be inadequate, whereby a good image tends to be hardly obtainable. On the other hand, if it exceeds the above range, stickiness of the resist film after drying tends to be substantial, whereby the operation efficiency tends to be poor. If the amount of the pigment is less than the above range, it tends to be difficult to attain a color density required for the preparation of color filter, and if it exceeds the above range, light absorption by the pigment tends to be too much, whereby internal photocuring will not take place, and a desired image will not be obtained. If the amount of the solvent is less than the above range, a photosensitive solution tends to be highly viscous, whereby the coating irregularity is likely to result, whereby the film thickness tends to be non-uniform, and the operation efficiency tends to be poor. If it exceeds the above range, no adequate film thickness tends to be obtained, and coating defects such as pin holes are likely to form.

In the present invention, in addition to the above essential components, it is possible to incorporate a sensitizer, a pigment-dispersion assisting agent, a coating property-improving agent, a crosslinking agent, a development-improving agent, a polymerization inhibitor, a plasticizer, a flame retardant, etc. These additives may be used alone or in combination of a plurality of them.

The composition of the present invention may be coated on a glass substrate by a conventional means such as a spin coater, a roll coater, a curtain coater or a screen printing. The coating film thickness is preferably from 0.5 μm to 10 μm. To dry the coating film, a convection oven or a hot plate is used. The drying temperature is from 50° C. to 150° C., and the drying time is preferably from 30 seconds to 60 minutes. For exposure, a high pressure mercury lamp is usually employed, and by exposure through a mask, a latent image will be formed by a resist film. By development with a solvent capable of dissolving a non-exposed portion, an image will be formed. As the developer, an organic solvent such as acetone, toluene or methyl ethyl ketone may be used. However, an alkali developing solution is preferred in view of an environmental problem. For example, an aqueous sodium hydroxide solution, an aqueous potassium hydroxide solution, an aqueous sodium carbonate solution, an aqueous potassium carbonate solution, aqueous ammonia, or an aqueous tetramethylammonium hydroxide solution may be employed. The development method is not particularly limited, and development can be carried out by a conventional method such as a paddling method, a dipping method or a spraying method. Further, prewetting may be employed. For the purpose of drying the developing solution after forming an image or increasing the curing of a resist film, post baking or post photocuring may, for example, be employed.

BEST MODE FOR CARRYING OUT THE INVENTION

Now, the present invention will be described in detail with reference to Examples. However, the present invention is by no means restricted by the following Examples unless it does not exceed the gist of the present invention.

PREPARATION EXAMPLE 1

20 g of a styrene/acrylic acid resin having an acid value of 200 and a molecular weight of 5,000, 0.2 g of p-methoxyphenol, 0.2 g of dodecyltrimethylammonium chloride and 40 g of propylene glycol monomethyl ether acetate, were charged into a flask, and 7.6 g of (3,4-epoxycyclohexyl)methyl acrylate was dropwise added thereto, and the mixture was reacted at a temperature of 100° C. for 30 hours. The reaction solution was re-precipitated in water and dried to obtain a resin. Neutralization titration was carried out with KOH, whereby the acid value of the resin was 80.

PREPARATION EXAMPLE 2

20 g of a styrene/acrylic acid resin having an acid value of 200 and a molecular weight of 5,000, 0.2 g of p-methoxyphenol, 0.2 g of dodecyltrimethylammonium chloride and 40 g of propylene glycol monomethyl ether acetate, were charged into a flask, and 7.7 g of a compound of (3,4-epoxycyclohexyl)methyl methacrylate was dropwise added thereto. The mixture was reacted at a temperature of 100° C. for 30 hours. The reaction solution was re-precipitated in water and dried to obtain a resin. Neutralization titration by KOH was carried out, whereby the acid value of the resin was 80.

PREPARATION EXAMPLE 3

20 g of a styrene/acrylic acid resin having an acid value of 200 and a molecular weight of 5,000, 0.2 g of p-methoxyphenol, 0.2 g of dodecyltrimethylammonium chloride and 40 g of propylene glycol monomethyl ether acetate, were charged into a flask, and 5.9 g of glycidyl methacrylate was dropwise added thereto. The mixture was reacted at a temperature of 100° C. for 30 hours. The reaction solution was re-precipitated in water and dried to obtain a resin. Neutralization titration was carried out with KOH, whereby the acid value of the resin was 80.

EXAMPLES 1 to 22 and COMPARATIVE EXAMPLES 1 to 32

To 100 parts by weight of a resin as identified in Table 1, a photopolymerization initiator as identified in Table 1 (in an amount as identified in Table 1), 50 parts by weight of dipentaerythritol hexaacrylate as a photopolymerizable monomer, 70 parts by weight of phthalocyanine blue (C.I 15;6) as a pigment and 1000 parts by weight of propylene glycol monomethyl ether acetate as a solvent, were added and thoroughly mixed to obtain a photosensitive liquid for a color filter. In the Table, the numbers for the initiator represent the following compounds.

b-1: 2,2'-bis(o-chlorophenyl)-4,4',5,5'-tetraphenylbiimidazole
b-2: 4,4'-dimethylaminobenzophenone
b-3: 4,4'-diethylaminobenzophenone
b-4: 2-(p-dimethylaminophenyl)benzoxazole
b-5: 2-(p-dimethylaminophenyl)benzothiazole
b-6: 2-(p-diethylaminophenyl)benzimidazole
b-7: compound of the above-mentioned formula (3)
b-8: compound of the above-mentioned formula (11)
b-9: compound of the above-mentioned formula (12)
b-10: compound of the above-mentioned formula (13)
b-11: compound of the above-mentioned formula (14)

b-12: compound of the above-mentioned formula (37)

The evaluation methods for the photosensitive liquids are as follows.

Each photosensitive liquid was coated on a glass substrate by a spin coater and dried on a hot plate for one minute, the thickness of the resist film was 1.5 μm. This sample was subjected to image exposure through a mask by a high pressure mercury lamp and then immersed in a 1% potassium carbonate aqueous solution at a developing temperature of 25° C. for one minute to obtain a resist pattern. The sensitivity of the resist was represented by the quantity of exposure with which the resist pattern was finished exactly with the image size of the mask. Further, the resolution was represented by the minimum size of the resist pattern thereby formed.

In the chemical resistance test, the developed sample was further heat-cured in a convection oven at 200° C. for 30 minutes and then immersed in N-methylpyrrolidone at room temperature for 30 minutes, whereupon the state of the resist film was visually observed and evaluated. The results are shown in Table 2.

TABLE 1

|  | Resin | Amount of initiator | |
| --- | --- | --- | --- |
| Example 1 | Prep. Example 1 | b-1 (10 parts by weight) | b-2 (5 parts by weight) |
| Example 2 | Prep. Example 1 |  | b-3 (5 parts by weight) |
| Example 3 | Prep. Example 1 |  | b-4 (5 parts by weight) |
| Example 4 | Prep. Example 1 |  | b-5 (5 parts by weight) |
| Example 5 | Prep. Example 1 |  | b-6 (5 parts by weight) |
| Example 6 | Prep. Example 1 | b-7 (10 parts by weight) | |
| Example 7 | Prep. Example 1 | b-8 (10 parts by weight) | |
| Example 8 | Prep. Example 1 | b-9 (10 parts by weight) | |
| Example 9 | Prep. Example 1 | b-10 (10 parts by weight) | |
| Example 10 | Prep. Example 1 | b-11 (10 parts by weight) | |
| Example 11 | Prep. Example 1 | b-12 (10 parts by weight) | |
| Example 12 | Prep. Example 2 | b-1 (10 parts by weight) | b-2 (5 parts by weight) |
| Example 13 |  |  | b-3 (5 parts by weight) |
| Example 14 |  |  | b-4 (5 parts by weight) |
| Example 15 |  |  | b-5 (5 parts by weight) |
| Example 16 |  |  | b-6 (5 parts by weight) |
| Example 17 |  | b-7 (10 parts by weight) | |
| Example 18 |  | b-8 (10 parts by weight) | |
| Example 19 |  | b-9 (10 parts by weight) | |
| Example 20 |  | b-10 (10 parts by weight) | |
| Example 21 |  | b-11 (10 parts by weight) | |
| Example 22 |  | b-12 (10 parts by weight) | |
| Comp. Ex. 1 | Styrene/acrylic | Benzophenone (10 parts by weight) | |
| Comp. Ex. 2 | acid resin | Acetophenone (10 parts by weight) | |
| Comp. Ex. 3 | acid value: 200 | Benzylmethylketal (10 parts by weight) | |
| Comp. Ex. 4 | Mw: 5,000 | 4-Dimethylaminoisoamyl benzoate (10 parts by weight) | |
| Comp. Ex. 5 |  | 4-Diethylaminoethyl benzoate (10 parts by weight) | |
| Comp. Ex. 6 |  | 2,4-Diethylthioxantone (10 parts by weight) | |
| Comp. Ex. 7 |  | 3,3-Dimethyl-4-methoxybenzophenone (10 parts by weight) | |
| Comp. Ex. 8 |  | 1-Hydroxy-cyclohexyl-phenyl ketone (10 parts by weight) | |
| Comp. Ex. 9 |  | 2-Methyl-1-(4-(thiophenyl)-2-morpholino)propane (10 parts by weight) | |
| Comp. Ex. 10 |  | 2-Hydroxy-2-methyl-1-phenylpropan-1-one (10 parts by weight) | |
| Comp. Ex. 11 |  | 2,2-Dimethoxy-1,2-diphenylethan-1-one (10 parts by weight) | |
| Comp. Ex. 12 |  | b-7 (10 parts by weight) | |
| Comp. Ex. 13 |  | b-8 (10 parts by weight) | |
| Comp. Ex. 14 |  | b-9 (10 parts by weight) | |
| Comp. Ex. 15 |  | b-10 (10 parts by weight) | |
| Comp. Ex. 16 |  | b-11 (10 parts by weight) | |
| Comp. Ex. 17 | Prep. Example 3 | Benzophenone (10 parts by weight) | |
| Comp. Ex. 18 |  | Acetophenone (10 parts by weight) | |
| Comp. Ex. 19 |  | Benzylmethylketal (10 parts by weight) | |
| Comp. Ex. 20 |  | 4-Dimethylaminoisoamyl benzoate (10 parts by weight) | |
| Comp. Ex. 21 |  | 4-Diethylaminoethyl benzoate (10 parts by weight) | |
| Comp. Ex. 22 |  | 2,4-Diethylthioxantone (10 parts by weight) | |
| Comp. Ex. 23 |  | 3,3-Dimethyl-4-methoxybenzophenone (10 parts by weight) | |
| Comp. Ex. 24 |  | 1-Hydroxy-cyclohexyl-phenyl ketone (10 parts by weight) | |
| Comp. Ex. 25 |  | 2-Methyl-1-(4-(thiophenyl)-2-morpholino)propane (10 parts by weight) | |
| Comp. Ex. 26 |  | 2-Hydroxy-2-methyl-1-phenylpropan-1-one (10 parts by weight) | |
| Comp. Ex. 27 |  | 2,2-Dimethoxy-1,2-diphenylethan-1-one (10 parts by weight) | |
| Comp. Ex. 28 |  | b-7 (10 parts by weight) | |
| Comp. Ex. 29 |  | b-8 (10 parts by weight) | |
| Comp. Ex. 30 |  | b-9 (10 parts by weight) | |
| Comp. Ex. 31 |  | b-10 (10 parts by weight) | |
| Comp. Ex. 32 |  | b-11 (10 parts by weight) | |

TABLE 2

| | Sensitivity | Resolution | Chemical resistance |
|---|---|---|---|
| Example 1 | 100 mj | <10μ | ◯ |
| Example 2 | 100 mj | <10μ | ◯ |
| Example 3 | 100 mj | <10μ | ◯ |
| Example 4 | 100 mj | <10μ | ◯ |
| Example 5 | 100 mj | <10μ | ◯ |
| Example 6 | 500 mj | <10μ | ◯ |
| Example 7 | 500 mj | <10μ | ◯ |
| Example 8 | 500 mj | <10μ | ◯ |
| Example 9 | 500 mj | <10μ | ◯ |
| Example 10 | 500 mj | <10μ | ◯ |
| Example 11 | 500 mj | <10μ | ◯ |
| Example 12 | 120 mj | <10μ | ◯ |
| Example 13 | 120 mj | <10μ | ◯ |
| Example 14 | 120 mj | <10μ | ◯ |
| Example 15 | 120 mj | <10μ | ◯ |
| Example 16 | 120 mj | <10μ | ◯ |
| Example 17 | 600 mj | <10μ | ◯ |
| Example 18 | 600 mj | <10μ | ◯ |
| Example 19 | 600 mj | <10μ | ◯ |
| Example 20 | 600 mj | <10μ | ◯ |
| Example 21 | 600 mj | <10μ | ◯ |
| Example 22 | 600 mj | <10μ | ◯ |
| Comp. Ex. 1 | >5000 mj | 50μ | X |
| Comp. Ex. 2 | >5000 mj | 50μ | X |
| Comp. Ex. 3 | >5000 mj | 50μ | X |
| Comp. Ex. 4 | >5000 mj | 50μ | X |
| Comp. Ex. 5 | >5000 mj | 50μ | X |
| Comp. Ex. 6 | >5000 mj | 50μ | X |
| Comp. Ex. 7 | >5000 mj | 50μ | X |
| Comp. Ex. 8 | >5000 mj | 50μ | X |
| Comp. Ex. 9 | >5000 mj | 50μ | X |
| Comp. Ex. 10 | >5000 mj | 50μ | X |
| Comp. Ex. 11 | >5000 mj | 50μ | X |
| Comp. Ex. 12 | 1000 mj | 50μ | X |
| Comp. Ex. 13 | 1000 mj | 50μ | X |
| Comp. Ex. 14 | 1000 mj | 50μ | X |
| Comp. Ex. 15 | 1000 mj | 50μ | X |
| Comp. Ex. 16 | 1000 mj | 50μ | X |
| Comp. Ex. 17 | >5000 mj | 20μ | Δ |
| Comp. Ex. 18 | >5000 mj | 20μ | Δ |
| Comp. Ex. 19 | >5000 mj | 20μ | Δ |
| Comp. Ex. 20 | >5000 mj | 20μ | Δ |
| Comp. Ex. 21 | >5000 mj | 20μ | Δ |
| Comp. Ex. 22 | >5000 mj | 20μ | Δ |
| Comp. Ex. 22 | >5000 mj | 20μ | Δ |
| Comp. Ex. 23 | >5000 mj | 20μ | Δ |
| Comp. Ex. 24 | >5000 mj | 20μ | Δ |
| Comp. Ex. 25 | >5000 mj | 20μ | Δ |
| Comp. Ex. 26 | >5000 mj | 20μ | Δ |
| Comp. Ex. 27 | >5000 mj | 20μ | Δ |
| Comp. Ex. 28 | 800 mj | 20μ | Δ |
| Comp. Ex. 29 | 800 mj | 20μ | Δ |
| Comp. Ex. 30 | 800 mj | 20μ | Δ |
| Comp. Ex. 31 | 800 mj | 20μ | Δ |
| Comp. Ex. 32 | 800 mj | 20μ | Δ |

◯: Resist film not peeled at all.
X: Resist film entirely peeled.
Δ: Resist film partially peeled.

As shown in Table 2, by combining a high molecular weight polymer having polymerizable groups in its side chains and a specific photopolymerization initiator, it is possible to obtain a color resist composition excellent in the image-forming performance and chemical resistance. In Examples, the same state as prior to immersion was maintained even after immersion in the solvent NMP for 30 minutes. Further, the sensitivity was higher by at least from about 1.3 to 50 times than Comparative Examples. With a polymer having no polymerizable group in its side chains, as in Comparative Examples 1 to 16, the chemical resistance is poor, and the sensitivity is low. As in Comparative Examples 17 to 32, if the side chains are changed to other polymerizable groups, the sensitivity deteriorates substantially, and the chemical resistance is poor. In Comparative Examples, after immersion in N-methylpyrrolidone, the resist film was partially or entirely peeled from the glass substrate.

EXAMPLES 23 to 26 and COMPARATIVE EXAMPLES 33 to 38

A composition as defined in Table 3 was subjected to dispersion treatment by a paint shaker for 10 hours to obtain a dispersed paste of carbon black MA-100 or MA-220, manufactured by Mitsubishi Chemical Corporation. To such a carbon black-dispersed paste, b-1 (2 parts by weight) and b-2 (1 part by weight) as initiators, dipentaerythritol hexaacrylate (15 parts by weight) and PGMEA (450 parts by weight) were added to obtain a black resist composition.

Then, the black resist composition photosensitive liquid was coated on a glass substrate in a thickness of 1 μm by a spin coater and baked on a hot plate at 100° C. for 60 seconds. Foreign matters on the resist coating film were visually observed, followed by image exposure through a mask by a high pressure mercury lamp, then immersion in a 0.05% potassium hydroxide aqueous solution at 25° C. for 30 seconds for development and rinsing with water to carry out patterning of the black resist. The quantity of exposure with which the pattern became the same size as the mask was taken as the sensitivity, and the minimum resist size thereby formed was observed by a microscope and taken as the resolution. The results are shown in Table 4. As is evident from Examples in Table 4, the composition of the present invention is excellent in the pigment dispersibility, whereby a black matrix of a high quality can be obtained at a high productivity.

TABLE 3

| | Components | | |
|---|---|---|---|
| | Resin (25 parts by weight) | Carbon black (50 parts by weight) | Solvent (100 parts by weight) |
| Example 23 | Preparation Example 1 | MA-100 | PGMEA |
| Example 24 | | MA-220 | (propylene glycol mono- |
| Example 25 | Preparation Example 2 | MA-100 | methyl ether acetate) |
| Example 26 | | MA-220 | |
| Comp. Ex. 33 | Preparation Example 3 | MA-100 | |
| Comp. Ex. 34 | | MA-220 | |

TABLE 3-continued

| | Components | | |
|---|---|---|---|
| | Resin (25 parts by weight) | Carbon black (50 parts by weight) | Solvent (100 parts by weight) |
| Comp. Ex. 35 | Styrene/acrylic acid resin (acid value: 200, Mw: 5,000 | MA-100 | |
| Comp. Ex. 36 | | MA-220 | |
| Comp. Ex. 37 | Benzyl methacrylate/ methacrylic acid resin (acid value: 200, Mw: 10,000) | MA-100 MA-220 | |

TABLE 4

| | Foreign matters on the resist film | Sensitivity | Resolution |
|---|---|---|---|
| Example 23 | Nil | 2000 mj | 20μ |
| Example 24 | Nil | 2000 mj | 20μ |
| Example 25 | Nil | 2500 mj | 20μ |
| Example 26 | Nil | 2500 mj | 20μ |
| Comp. Ex. 33 | Observed | 4000 mj | 50μ |
| Comp. Ex. 34 | Observed | 4000 mj | 50μ |
| Comp. Ex. 35 | Observed | 5000 mj | >50μ |
| Comp. Ex. 36 | Observed | 5000 mj | >50μ |
| Comp. Ex. 37 | Observed (large amount) | Impossible to form an image | |
| Comp. Ex. 38 | Observed (large amount) | Impossible to form an image | |

As described in the foregoing, the composition of the present invention is very useful not only for forming colored patterns of red, green and blue for a color filter but also for forming a black matrix.

INDUSTRIAL APPLICABILITY

The polymerizable composition of the present invention is highly sensitive and excellent in chemical resistance, whereby a color filter of a high quality can be produced without a protective film such as an oxygen-shielding film.

We claim:

1. A polymerizable composition for a color filter, which comprises a (meth)acrylate copolymer containing alicyclic (meth)acryloyl groups in its side chains, a compound having at least one ethylenically unsaturated double bond, a photopolymerization initiator and a colorant; said photopolymerization initiator being a combination of an imidazole compound and an aminobenzene derivative.

2. The polymerizable composition for a color filter according to claim 1, wherein the photopolymerization initiator system further contains an aromatic mercapto compound.

3. The polymerizable composition for a color filter according to claim 1, wherein the colorant comprises a red, green or blue pigment and wherein the ratio of P/V is within a range of from 0.15 to 0.6, where P is the content by weight of a red, green or blue pigment, and V is the content by weight of the solid content other than the pigment.

4. A color filter having an image provided on a substrate, said color filter being formed from a polymerizable composition comprising a (meth)acrylate copolymer containing alicyclic (meth)acryloyl groups in its side chains, a compound having at least one ethylenically unsaturated double bond, a photopolymerization initiator and a colorant; wherein said photopolymerization initiator is a combination of an imidazole compound and an aminobenzene derivative.

5. The color filter according to claim 4, wherein the photopolymerization initiator system further contains an aromatic mercapto compound.

6. The color filter according to claim 4, wherein the colorant comprises a red, green or blue pigment and wherein the ratio of P/V is within a range of from 0.15 to 0.6, where P is the content by weight of a red, green or blue colorant, and V is the content by weight of the solid content other than the colorant.

* * * * *